United States Patent

Oktay et al.

[15] 3,706,127

[45] Dec. 19, 1972

[54] METHOD FOR FORMING HEAT SINKS ON SEMICONDUCTOR DEVICE CHIPS

[72] Inventors: Sevgin Oktay, Beacon; Arnold F. Schmeckenbecher, Poughkeepsie, both of N.Y.

[73] Assignee: International Business Machines Corporation, Armonk, N.Y.

[22] Filed: April 27, 1970

[21] Appl. No.: 32,237

[52] U.S. Cl. .........................29/576, 29/420, 29/580

[51] Int. Cl. ............................................B01j 17/00

[58] Field of Search...29/527.2, 527.4, 420, 455 LM, 29/608, 576; 317/234 A

[56] References Cited

UNITED STATES PATENTS

| | | | |
|---|---|---|---|
| 3,128,544 | 4/1964 | Allingham | 29/455 LM |
| 2,849,312 | 8/1958 | Peterman | 29/608 |
| 3,384,795 | 5/1968 | Lochner | 29/608 |

*Primary Examiner*—Richard J. Herbst
*Assistant Examiner*—W. Tupman
*Attorney*—Hanifin and Janicin and Robert J. Haase

[57] ABSTRACT

A method is disclosed for producing a brush-like heat exchanging structure on a semiconductor device chip. A given amount of ferromagnetic powder is distributed uniformly in an electroless plating bath. Completed semiconductor device wafers are placed at the bottom of the bath, the rear wafer surfaces facing upward. An array of poles of a single electro-magnet is placed immediately below each wafer, each pole registering with a respective chip position on the wafer. The ferro-magnetic powder is permitted to settle on the rear surfaces of the wafers and then current is applied to each electro-magnet attracting substantially equal amounts of ferro-magnetic powder toward each magnet pole. This results in the erection of brush-like structures of ferro-magnetic particles on the rear surfaces of the wafer opposite the individual poles. The bath temperature is then raised to the required operating temperature for electroless plating while each electro magnet remains energized. A uniform deposit of electroless metal transforms the brush-like structures into rigid heat exchangers firmly attached to each wafer at the chip locations. The wafers are then diced to yield individual chips each having its own heat exchanging structure.

5 Claims, 5 Drawing Figures

INVENTORS
SEVGIN OKTAY
ARNOLD F. SCHMECKENBECHER

BY Robert J. Haase

ATTORNEY

METHOD FOR FORMING HEAT SINKS ON SEMICONDUCTOR DEVICE CHIPS

BACKGROUND OF THE INVENTION

Some computer technologies require very high power dissipation at the microcircuit chip level, for example, power densities of the order of approximately 500 watts per square inch. Even with direct immersion cooling, i.e., boiling such high heat flux cannot be sustained in most commercially available dielectric coolants such as the fluorocarbon chemical liquid types. Consequently, it becomes necessary to mount a suitable heat exchanger directly on each chip in order to increase chip surface area and thereby reduce to a workable level the power density encountered by the coolant. The design of a suitable heat sink, however, is seriously impacted by the small magnitude of the available chip area typically of the order of a tenth of an inch. The necessarily close spacing between the individual cooling elements of a miniaturized heat exchanger ordinarily precludes efficient and continuous bubble nucleation for coolant boiling over the range of chip power dissipation of interest. Without efficient and continuous bubble nucleation, the temperature of the chip not only is raised to undesirably high average value but also is subject to wide fluctuation (in a "saw tooth" manner) with changes in chip power dissipation.

SUMMARY OF THE INVENTION

Efficient and continuous bubble nucleation over a substantial range of chip power dissipation values is achieved in accordance with the present invention by the formation of a brush-like structure composed of magnetically aligned ferromagnetic particles on the rear surface of each microcircuit chip. In a preferred embodiment, brush-like structures are formed on the rear surface of a wafer prior to dicing in registration with an array of completed microcircuit devices formed on the opposite wafer surface. The device side of the wafer is covered by a layer of resist material for protection against the sensitizing and plating steps of the present invention. The back surface of the wafer is activated for the deposition of electroless metal and the wafer is placed at the bottom of a vessel containing a conventional electroless nickel bath. Small ferro-magnetic particles also are activated and are distributed uniformly in the electroless metal bath. A slightly divergent magnetic field is produced at the location of each microcircuit chip by a multiple pole electro-magnet whose poles are placed against the device side of the wafer in registration with the array pattern of the chips on the wafer. As the ferro-magnetic particles gradually settle on the rear surface of the wafer, the electro-magnet is energized to erect the particles into brush-like structures of slightly diverging "bristles" at locations opposite the microcircuit chips. The temperature of the electroless metal bath then is raised to operational value causing the deposition of a uniform layer of electroless metal over the entire surfaces of the brush-like structures and the back surface of the wafer so as to create one integral mechanically sound and thermally efficient heat exchanger bonded to the back surface of the wafer at each chip location. The individual chips subsequently are separated by conventional dicing operations.

DESCRIPTION OF THE PREFERRED EMBODIMENT

Figure 1:
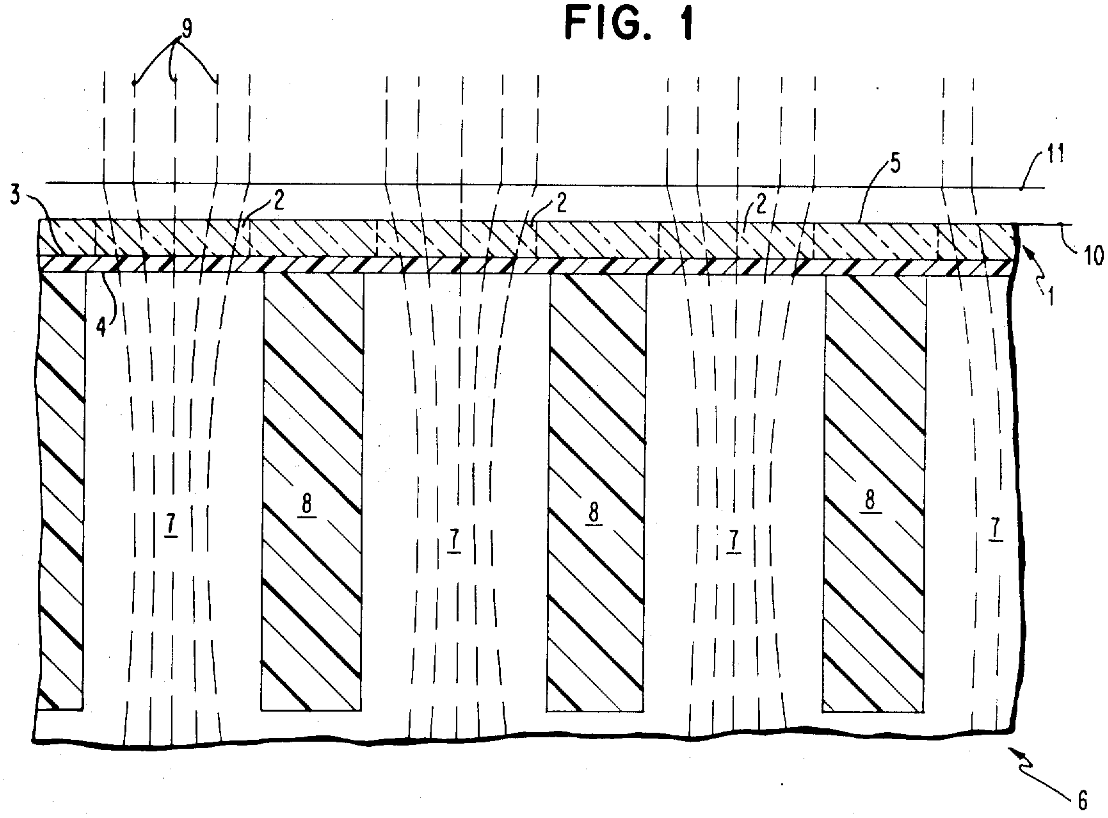
FIG. 1 is a simplified sketch of a portion of the electromagnet pole array in registration with a portion of the microcircuit chip array in a preferred embodiment of the present invention.

Referring to FIG. 1, semiconductor wafer 1 is processed in a conventional manner to produce an array of completed microcircuit devices (not shown) at chip locations 2 ready for dicing whereby they are separated from each other and from wafer 1. The microcircuit devices and the terminals for making contact thereto are formed along the front surface 3 of wafer 1. A layer of photoresist material 4 such as a stop-off lacquer photoresist, etc. is placed on surface 3 in order to protect the microcircuit devices from the action of the electroless nickel plating bath in which the entire structure of FIG. 1 is immersed in a subsequent step of the present method. The rear surface 5 of wafer 1 is sensitized for the deposition of electroless nickel by dipping in a palladium chloride solution in a well known manner.

The sensitized and coated wafer 1 is placed upon multiple pole electromagnet 6 with the front surface 3 of wafer 1 facing an array of electromagnet poles conforming to the array of microcircuit chips 2. The spaces between the adjacent poles 7 of electromagnet 6 are filled with a non-magnetic material 8 such as for example an epoxy material so as to provide a continuous flat surface for supporting wafer 1. A source (not shown) is provided to produce the magnetic field represented by lines 9. It will be noted that the field lines 9 are relatively crowded within each pole 7 whereas they diverge and are spread farther apart within the non-magnetic medium of the coated wafer and beyond. The divergent region of particular interest to the present invention lies between the reference lines 10 and 11. The field divergence would continue above line 11 if only one pole were present. However, the presence of the adjacent poles of the same polarity in the array restricts the magnetic lines from further divergence and they become substantially parallel above the position of line 11.

Figure 2:
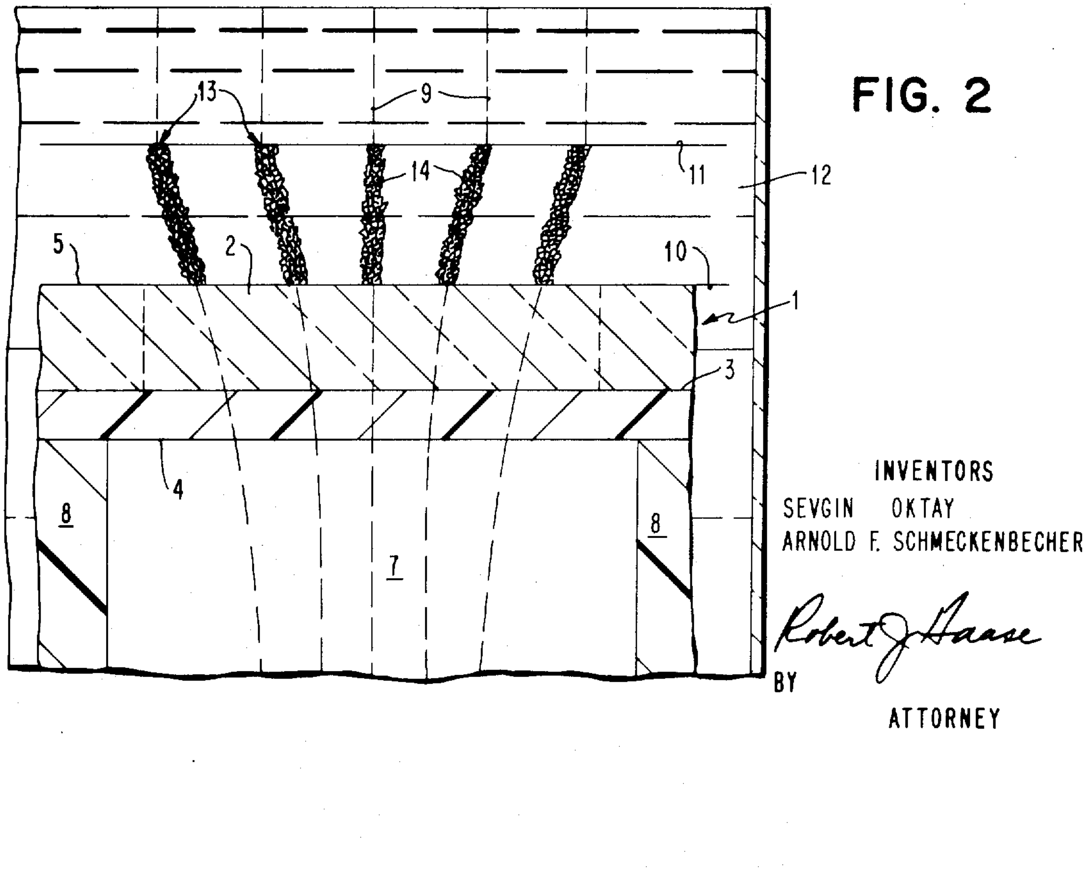
FIG. 2 is an enlarged view of one pole and chip pair of FIG. 1 during the magnetic alignment of a respective brush-like heat exchanger.

The entire structure of FIG. 1 is immersed in a conventional electroless nickel plating bath 12 as shown in the enlarged view of FIG. 2 which represents one of the poles 7 and its respective microcircuit chip 2 of FIG. 1. Plating bath 12 also contains sensitized ferro-magnetic particles 14 of irregular small size, (for example, nickel particles of the order of microns diameter) originally in uniform distribution. With the passage of time, however, the particles settle uniformly on the rear surface 5 of wafer 1. Upon the energization of the electromagnet pole and the particle 14 form a brush-like structure of slightly diverging "bristles" 13.

Ferromagnetic particles such as particles 14 having no permanent magnetic moment become aligned in an applied magnetic field in such a way that a maximum of field lines (up to the magnetic saturation of the material) is accommodated inside the particles for the greatest possible path length. If the ferromagnetic particles do not happen to be in such alignment, the particles experience torques which tend to rotate them into such alignment as shown in FIG. 2. If the applied magnetic field is inhomogeneous, i.e., if there is a field gradient or divergence, particles additionally are attracted in the direction of the increasing field. The divergence of field lines 9 cause the individual ferromagnetic particles 14 to be attracted to each other and to the back surface 5 of wafer 1 with sufficient force to erect and maintain the brush-like structure throughout the interval required for the deposition of a sufficient thickness of electroless nickel around the entire surfaces of bristles 13 and back surface 5 of wafer 1 to transform the entire structure into one rigid member. The bristles grow in length substantially only within the region between horizontal lines 10 and 11 where there is magnetic field divergence. Inasmuch as the magnetic field lines 9 are substantially parallel beyond line 11, the force of attraction between the particles 14 is insufficient to prevent their being floated away from wafer 1 due to the thermal currents and bubble agitation normally associated with the operation of the electroless plating process.

In the region between parallel lines 10 and 11, the bristles 13 develop magnetic poles at their extremities that tend to repel one another to maintain separation and to prevent the formation of a lumped mass of particles. The amount of separation between the individual bristles 13 varies inversely with the divergence of the magnetic field lines 9. That is, the repulsion between the poles of the individual bristles causes a wider spacing between the bristles and a more open structure in the resulting heat sink as the divergence of the magnetic field lines 9 is decreased. Where a highly divergent magnetic field is applied, on the other hand, the ferromagnetic particles are strongly attracted and pulled close to each other in the direction of increasing field strength to substantially overcome the repulsion attributable to the secondary poles of the bristles and to produce a more densely packed brush-like heat sink with close spacing between bristles. Other factors which also effect the final form of the heat sink include the value of the magnetic susceptability of the ferromagnetic particles, particle size and shape, the viscosity and agitation of the electroless plating bath, and the formation of gas bubbles during the plating process.

It is preferable that the electromagnet be energized after a lapse of time to allow the ferromagnetic particles 14 in the plating bath 12 to settle uniformly on the back surface 5 of wafer 1. After the particles have settled, the electromagnet current is turned on establishing the magnetic field lines 9 and attracting substantially equal amounts of particles toward each magnet pole. The viscosity of the plating bath may be increased in order to slow down the rate of settling of the ferromagnetic powder, resulting in a more uniform powder layer.

Figure 3:
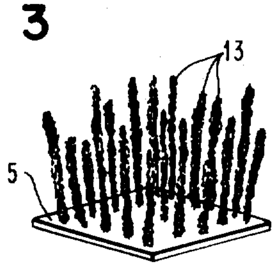
FIG. 3 is a simplified sketch in perspective of a completed heat exchanger formed at one chip location.
Figure 4:
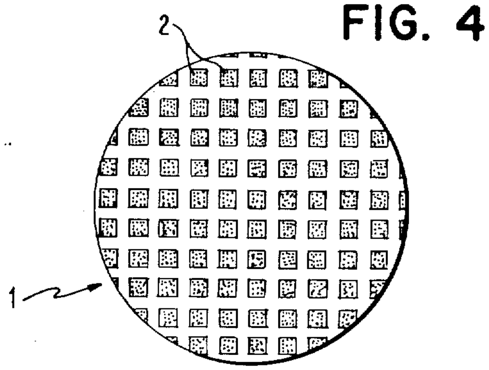
FIG. 4 is a plan view of an array of heat exchange structures of FIG. 3 formed on a single wafer.

Conventional thickeners such as certain polysaccharides, may be used to increase the viscosity of the plating solution. Then the plating bath 12 is heated to the required temperature for nickel deposition. The deposition temperature is maintained until a sufficient nickel coating is produced to transform the magnetically oriented brush-like heat sink structures into rigid members soundly bonded to the back surface 5 of wafer 1 as shown in FIGS. 3 and 4. The array of FIG. 4 of microcircuit devices with respective plated heat sinks as shown in FIG. 3 is now ready for dicing operations for the separation of the individual device chips in a well known manner. The separated microcircuit devices later are bonded to a supporting module in accordance with conventional flip-chip practice with the brush-like heat exchange structure extending away from the module and into a coolant material such as forced air or a liquid fluorocarbon.

Figure 5:
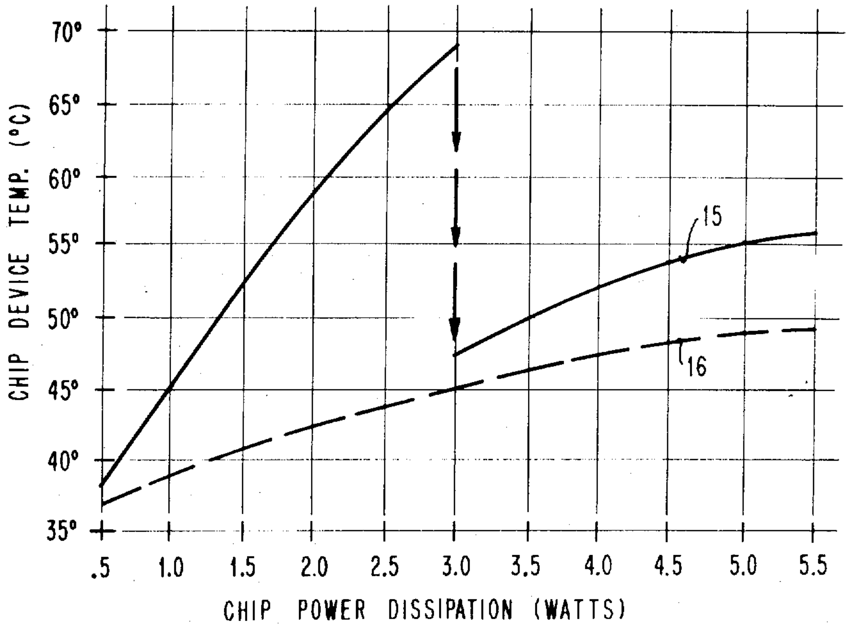
FIG. 5 is a plot of microcircuit chip temperature as a function of chip power dissipation comparing the characteristic of the present invention with typical prior art.

An important feature of the brush-like heat exchanging structure produced by the method of the present invention is the manner in which a liquid coolant material is brought to a boil by the power dissipation in the chip to which the heat exchanger is joined. As shown in the comparative plots of FIG. 5, the temperature of the microcircuit chip having the heat sink provided by the present invention (curve 16) increases relatively slightly and in a smooth monotonic manner with increase of chip power dissipation. This is in contrast to the corresponding characteristics of a prior art solid heat sink (curve 15) when substituted for the brush-like heat sink of the present invention and subjected to the same coolant boiling test conditions. It will be noted that curve 15 evidences higher overall microcircuit device temperature as well as a delayed initiation of coolant boiling which permits the microcircuit device temperature to rise undesirably high during precursory convection cooling before the commencement of the relatively efficient cooling associated with boiling. In the example represented by curve 15, the microcircuit chip is cooled in the region between 0.5 and 3.0 watts of chip power dissipation primarily by convection within the coolant material. An abrupt transition occurs at about 3.0 watts dissipation when the coolant suddenly boils with a corresponding sharp reduction in microcircuit chip temperature as a result of the more vigorous and efficient cooling action associated with coolant boiling. Additional data shows that the magnitude of the abrupt temperature transition is dependent upon the identity of the coolant employed. Coolants of the silicate ester type tend to increase the said magnitude relative to coolants which are not of an "oily" nature. However, the brush-like heat exchanging structure of the present invention maintains its smooth monotonic coolant boiling characteristic irrespective of coolant type.

It can be shown that the surface condition of a heat exchanger is an important parameter in a boiling heat transfer process. It is believed that the bubble nucleation process (by which coolant boiling is initiated) is substantially enhanced by small scale cavities in the surface of the heat exchanger produced by the method of the present invention. Bubbles form at a heated surface from active cavities which already have some gas or vapor present in them. As the heat exchanger surface surrounding the active cavity is heated, heat is transmitted to the liquid-vapor coolant interface where evaporation takes place thereby causing the bubble to grow. The bubble continues to grow until it detaches from the surface leaving a portion of the vapor trapped inside the active cavity. Depending upon the bubble size and the proximity of other cavities, this vapor trapping process can induce neighboring inactive cavities filled with pure liquid coolant into activity. Aside from the shape of the cavities, surface roughness also has an effect on the stability of a trapped bubble. For example, surface roughness can be related to the contact angle that a bubble forms with the surface. The stability of the contact angle and of the bubble itself depends upon surface roughness. Inasmuch as the surface of the heat exchanger produced by the present invention is characterized by a wide range of roughness, there is a high probability that a corresponding wide range of unstable bubbles are present. The unstable bubbles detach from the heat exchanger surface very easily at relatively low temperatures and over a broad temperature spectrum whereby the coolant boiling process commences early and continues throughout the chip power dissipation range as represented by curve 16 of FIG. 5.

The optimum surface roughness distribution associated with the individual bristles comprising the brush-like heat exchanging structure of the present invention is achieved by the magnetic orientation process for erecting and aligning the individual ferromagnetic particles. The optimum surface roughness is preserved during the electroless plating operation. Any convenient, conventional electroless plating technique or any other process that results in a uniform thickness conformal film on the bristles 13 of FIG. 2 can be used with the method of the present invention. Such processes maintain the optimum surface roughness characteristic of the heat exchanger and avoid the delayed nucleation boiling characteristic represented by curve 15 of FIG. 5 in the case of the prior art solid heat sink which has a relatively smooth surface.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A method for producing a brush-like heat exchanging structure on the rear surfaces of individual semiconductor device chips comprising:

providing a wafer having an array of semiconductor devices formed at respective chip locations on the front surface thereof, providing a uniform distribution of ferromagnetic particles on the rear surface of said wafer, providing an array of divergent magnetic fields at said rear surface of said wafer in registration with said chip locations thereby erecting and maintaining brush-like heat exchanging structures at said rear surface of said wafer at chip locations, depositing a conformal coating on the brush-like structures and said wafer, maintaining said magnetic fields until a sufficient conformal coating has transformed said brush-like structures into rigid heat exchangers attached to rear surface of said wafer, and dicing said wafer so as to yield said individual chips.

2. A method for producing a brush-like heat exchanging structure on the rear surface of a semiconductor device chip comprising:

providing an electroless metal plating bath containing a uniform distribution of ferromagnetic particles, placing a semiconductor device chip in said bath so as to allow said particles to settle on said rear surface of said chip, providing a divergent magnetic field at said rear surface of said chip thereby to erect and maintain said brush-like structure comprising said ferromagnetic particles, adjusting the temperature of said bath to cause the deposition of a conformal electroless metal coating on said brush-like structure and said rear surface of said chip, and maintaining said magnetic field until a sufficient conformal coating of electroless metal has transformed said brush-like structure into a rigid heat exchanger attached to said rear surface of said chip.

3. The method defined in claim 2 wherein: said ferromagnetic powder is nickel, and said bath is an electroless nickel plating bath.

4. A method for producing a brush-like heat exchanging structure on the rear surface of individual semiconductor device chips comprising:

providing an electroless metal plating bath containing a uniform distribution of ferromagnetic particles, placing in said bath a wafer having an array of semiconductor devices formed at respective chip locations on the front surface thereof so as to allow said particles to settle on the rear surface of said wafer, providing an array of divergent magnetic fields at said rear surface of said wafer in registration with said chip locations thereby erecting and maintaining brush-like heat exchanging structures at said rear surface of said wafer at said chip locations, adjusting the temperature of said bath to cause the deposition of a conformal electroless metal coating to transform said brush-like structures into rigid heat exchangers attached to said rear surface of said wafer at said chip locations, and dicing said wafer so as to yield said individual chips.

5. The method defined in claim 4 wherein: said ferromagnetic powder is nickel, and said bath is an electroless nickel plating bath.

* * * * *